US011115046B2

(12) United States Patent
Parupalli et al.

(10) Patent No.: US 11,115,046 B2
(45) Date of Patent: Sep. 7, 2021

(54) CLOSED LOOP CONTROL IN A CAMERA MODULE

(71) Applicant: Cirrus Logic International Semiconductor Ltd., Edinburgh (GB)

(72) Inventors: Vamsikrishna Parupalli, Austin, TX (US); Mark May, Austin, TX (US); Saurabh Singh, Cedar Park, TX (US); Ramya Balasundaram, Austin, TX (US); Mengde Wang, Austin, TX (US); Eric B. Smith, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 150 days.

(21) Appl. No.: 16/431,276

(22) Filed: Jun. 4, 2019

(65) Prior Publication Data

US 2019/0379389 A1 Dec. 12, 2019

Related U.S. Application Data

(60) Provisional application No. 62/683,363, filed on Jun. 11, 2018.

(51) Int. Cl.
*H04N 5/232* (2006.01)
*H03M 1/50* (2006.01)
*H03M 1/82* (2006.01)
*H03M 3/00* (2006.01)
(Continued)

(52) U.S. Cl.
CPC .......... *H03M 3/432* (2013.01); *H03M 1/122* (2013.01); *H03M 1/504* (2013.01); *H03M 1/822* (2013.01); *H04N 5/23212* (2013.01); *G03B 5/00* (2013.01); *H04N 5/23287* (2013.01)

(58) Field of Classification Search
CPC .. G03B 7/10; H04N 5/23245; H04N 5/23212; H03M 1/822; H03M 1/504; H01M 1/122
USPC ....... 348/220.1, 357, 28.7, 208.99; 318/590; 396/133–136
See application file for complete search history.

(56) References Cited

U.S. PATENT DOCUMENTS

| 6,995,537 | B1 * | 2/2006 | Plutowski | ............ | G11B 5/5565 |
| | | | | | 318/400.04 |
| 7,224,135 | B1 | 5/2007 | Menegoli | | |
| 8,716,959 | B2 | 5/2014 | David et al. | | |

(Continued)

OTHER PUBLICATIONS

Examination Report under Section 18(3), UKIPO, Application No. GB2000452.9, dated Feb. 17, 2020.

(Continued)

*Primary Examiner* — Xi Wang
(74) *Attorney, Agent, or Firm* — Jackson Walker L.L.P.

(57) ABSTRACT

A system may include an output stage for driving a load at an output of the output stage, a pulse-width modulation mode path configured to pre-drive the output stage in a first mode of operation, a linear mode path configured to pre-drive the output stage in a second mode of operation and a loop filter coupled at its input to the output of the output stage and coupled at its output to both of the pulse-width modulation mode path and the linear mode path. The pulse-width modulation mode path and the linear mode path may be configured such that a first transfer function between the output of the loop filter and the output of the output stage is substantially equivalent to a second transfer function between the output of the loop filter and the output of the output stage.

20 Claims, 3 Drawing Sheets

(51) Int. Cl.
*H03M 1/12* (2006.01)
*G03B 5/00* (2021.01)

(56) References Cited

U.S. PATENT DOCUMENTS

2002/0181141 A1 12/2002 Kuroiwa et al.
2016/0057347 A1* 2/2016 Gleason ................ H04N 5/217
　　　　　　　　　　　　　　　　　　 348/220.1

OTHER PUBLICATIONS

International Search Report and Written Opinion of the International Searching Authority, International Application No. PCT/US2019/036289, dated Sep. 3, 2019.
Anonymous, "Closed-loop transfer function—Wikipedia", May 27, 2018, retrieved from the Internet , https://en.wikipedia.org/w/index.php?title=Closed-loop_transfer_function&oldid=843164049, retrieved on Aug. 26, 2019.

* cited by examiner

CLOSED LOOP CONTROL IN A CAMERA MODULE

RELATED APPLICATION

The present disclosure claims priority to U.S. Provisional Patent Application Ser. No. 62/683,363, filed Jun. 11, 2018, which is incorporated by reference herein in its entirety.

FIELD OF DISCLOSURE

The present disclosure relates in general to electronic devices, and more particularly, to closed loop control in circuits driving an output current signal, including a camera module.

BACKGROUND

Many traditional mobile devices (e.g., mobile phones) include one or more cameras for capturing images. To provide for image stabilization and focus, a position of a camera within a plane substantially parallel to a subject of an image as well as a position of a lens of the camera in a direction perpendicular to such plane, may be controlled by a plurality of motors under the control of a camera controller. A control system may be implemented using an applications processor of the mobile device coupled via a communication interface (e.g., an Inter-Integrated Circuit or I2C interface) to a camera controller local to the camera and its various motors. For example, the applications processor may communicate to the camera controller a vector of data regarding a target position for an applications processor, whereas the camera controller may communicate to the applications processor a vector regarding an actual position of the camera, as sensed by a plurality of magnetic sensors (e.g., Hall sensors) and/or other appropriate sensors.

The motors of a camera may require to be driven by an electrical current, rather than an electrical voltage as is the case for other types of transducer loads. In addition, applications other than camera motors may require a current drive, such as haptic devices, for example. In such systems in which an electrical current is driven into a load, a mechanical mass's position may be controlled in space by providing a force which is generated by the electrical current. Driving the current as a pulse-width modulation (PWM) signal may maximize power efficiency of a system, while driving a linear current at the cost of power efficiency may improve accuracy due to lower noise in a linear driver compared to that of a PWM driver. Accordingly, it may be beneficial to provide a multi-mode current driver switchable between a PWM drive and a linear drive. However, switching between operational modes in such a multi-mode current driver may cause signal artifacts that may be undesirable, including causing undesired positional changes in motors of a camera system.

SUMMARY

In accordance with the teachings of the present disclosure, the disadvantages and problems associated with controlling mechanical components in a camera module and other current-driven loads may be reduced or eliminated.

In accordance with embodiments of the present disclosure, a system may include an output stage for driving a load at an output of the output stage, a pulse-width modulation mode path configured to pre-drive the output stage in a first mode of operation, a linear mode path configured to pre-drive the output stage in a second mode of operation and a loop filter coupled at its input to the output of the output stage and coupled at its output to both of the pulse-width modulation mode path and the linear mode path. The pulse-width modulation mode path and the linear mode path may be configured such that a first transfer function between the output of the loop filter and the output of the output stage is substantially equivalent to a second transfer function between the output of the loop filter and the output of the output stage.

In accordance with these and other embodiments of the present disclosure, a method may include in a first mode of operation, pre-driving with a pulse-width modulation mode path an output stage for driving a load at an output of the output stage. The method may also include in a second mode of operation, pre-driving the output stage with a linear mode path. The method may further include filtering the output signal with a loop filter coupled at its input to the output of the output stage and coupled at its output to both of the pulse-width modulation mode path and the linear mode path. The pulse-width modulation mode path and the linear mode path may be configured such that a first transfer function between the output of the loop filter and the output of the output stage is substantially equivalent to a second transfer function between the output of the loop filter and the output of the output stage.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
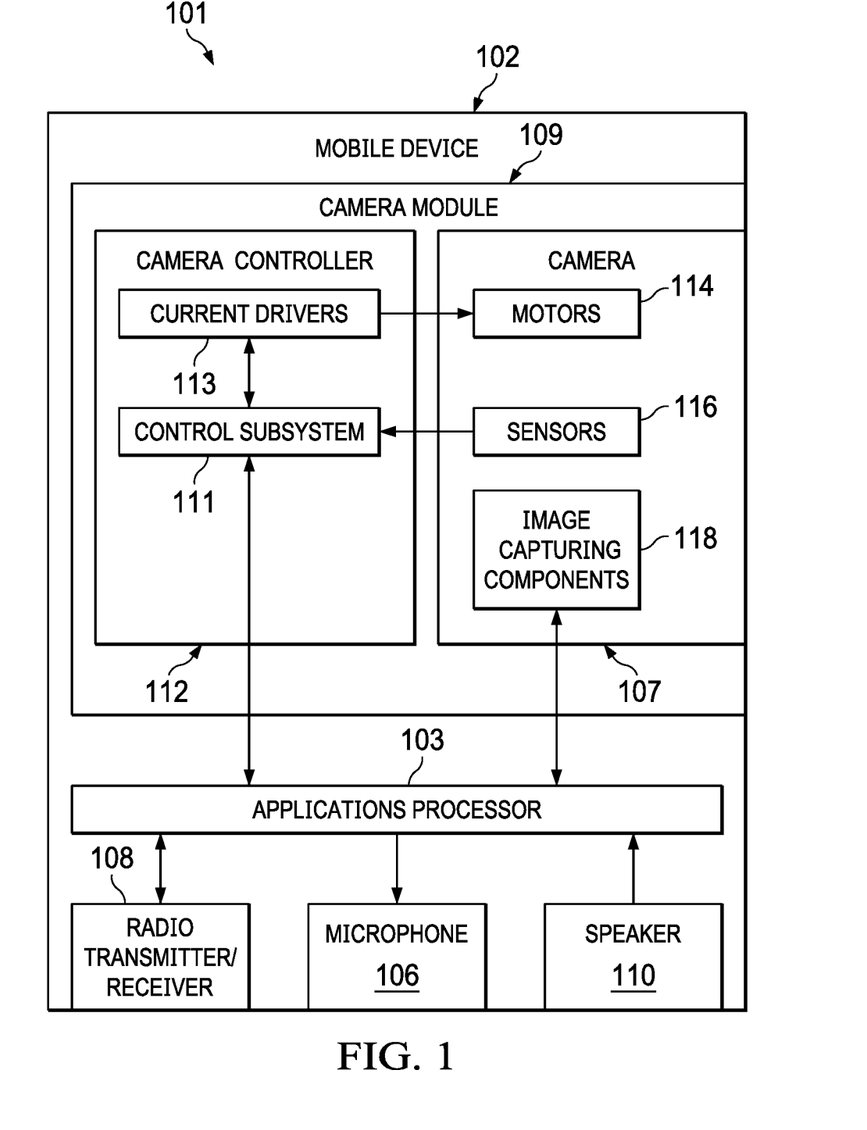
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, an applications processor 103, a microphone 106, a radio transmitter/receiver 108, a speaker 110, and a camera module 109 comprising a camera 107 and a camera controller 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Applications processor 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, applications processor 103 may interpret and/or execute program instructions and/or process data stored in a memory (not explicitly shown) and/or other computer-readable media accessible to applications processor 103.

Microphone 106 may be housed at least partially within enclosure 101, may be communicatively coupled to applications processor 103, and may comprise any system, device, or apparatus configured to convert sound incident at microphone 106 to an electrical signal that may be processed by applications processor 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to applications processor 103, and may include any system, device, or apparatus configured to, with the aid of an antenna, generate and transmit radio-frequency signals as well as receive radio-frequency signals and convert the information carried by such received signals into a form usable by applications processor 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

Speaker 110 may be housed at least partially within enclosure 101 or may be external to enclosure 101, may be communicatively coupled to applications processor 103, and may comprise any system, device, or apparatus configured to produce sound in response to electrical audio signal input. In some embodiments, speaker 110 may comprise a dynamic loudspeaker, which employs a lightweight diaphragm mechanically coupled to a rigid frame via a flexible suspension that constrains a voice coil to move axially through a magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Camera 107 may be housed at least partially within enclosure 101 (and partially outside of enclosure 101, to enable light to enter a lens of camera 107), and may include any suitable system, device, or apparatus for recording images (moving or still) into one or more electrical signals that may be processed by applications processor 103. As shown in FIG. 1, camera 107 may include a plurality of motors 114, sensors 116, and image capturing components 118.

Image capturing components 118 may include a collection of components configured to capture an image, including without limitation one or more lenses and image sensors for sensing intensities and wavelengths of received light. Such image capturing components 118 may be coupled to applications processor 103 such that camera 107 may communicate captured images to applications processor 103.

Motors 114 may be mechanically coupled to one or more of image capturing components 118 and each motor 114 may include any suitable system, device, or apparatus configured to, based on current signals received from camera controller 112 indicative of a desired camera position, cause mechanical motion of such one or more image capturing components 118 to a desired camera position.

Sensors 116 may be mechanically coupled to one or more of image capturing components 118 and/or motors 114 and may be configured to sense a position associated with camera 107. For example, a first sensor 116 may sense a first position (e.g., x-position) of camera 107 with respect to a first linear direction, a second sensor 116 may sense a second position (e.g., y-position) of camera 107 with respect to a second linear direction normal to the first linear direction, and a third sensor 116 may sense a third position (e.g., z-position) of camera 107 (e.g., position of lens) with respect to a third linear direction normal to the first linear direction and the second linear direction.

Camera controller 112 may be housed within enclosure 101, may be communicatively coupled to camera 107 and applications processor 103 (e.g., via an Inter-Integrated Circuit (I2C) interface), and may include any system, device, or apparatus configured to control motors 114 or other components of camera 107 to place components of camera 107 into a desired position. Camera controller 112 may also be configured to receive signals from sensors 116 regarding an actual position of camera 107 and/or regarding a status of camera 107. As shown in FIG. 1, camera controller 112 may include a control subsystem 111 and current drivers 113.

Control subsystem 111 may be integral to camera controller 112, and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, control subsystem 111 may interpret and/or execute program instructions and/or process data stored in a memory and/or other computer-readable media accessible to control subsystem 111. Specifically, control subsystem 111 may be configured to perform functionality of camera controller 112, including but not limited to control of motors 114 and receipt and processing of data from sensors 116.

Current drivers 113 may comprise a plurality of circuits, each such circuit configured to receive one or more control signals from control subsystem 111 (including without limitation a signal indicative of a desired target current for a motor 114) and drive a current-mode signal to a respective motor 114 in accordance with the one or more control signals in order to control operation of such respective motor 114. In some embodiments, one or more of current drivers 113 may comprise a multi-mode current driver as described in greater detail below with respect to FIGS. 2 and 3.

Figure 2:
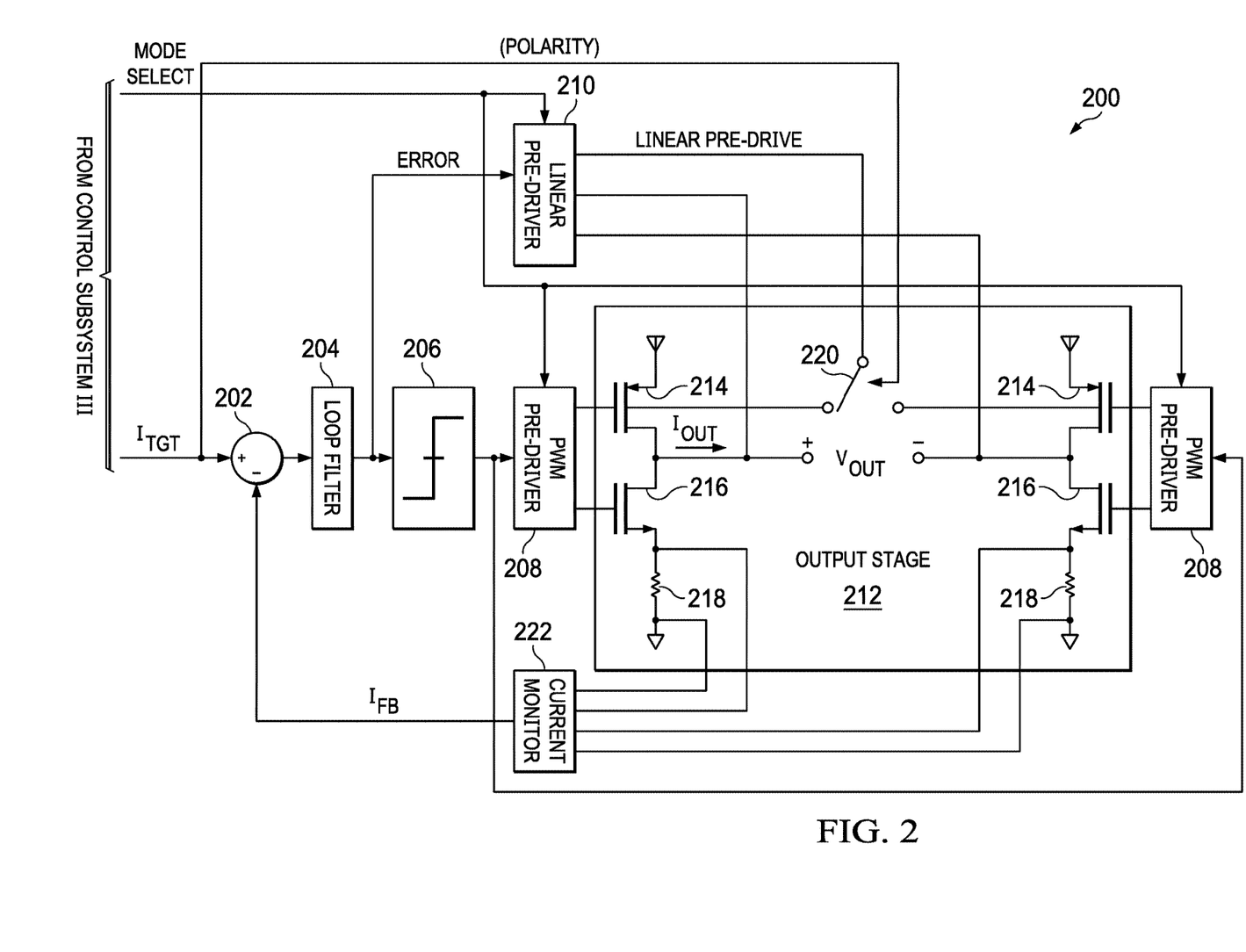
FIG. 2 illustrates a block diagram of selected components of an example multi-mode current driver, in accordance with embodiments of the present disclosure.

FIG. 2 illustrates a block diagram of selected components of an example multi-mode current driver 200, in accordance with embodiments of the present disclosure. In some embodiments, multi-mode current driver 200 may be used to implement one or more of current drivers 113 of FIG. 1. As shown in FIG. 2, multi-mode current driver 200 may comprise a combiner 202, a loop filter 204, a quantizer 206, a PWM pre-driver 208 (which may be split into two as shown in FIG. 2 to generate differential pre-driver signals), a linear pre-driver 210, an output stage 212, and a current monitor 222.

Combiner 202 may comprise any system, device, or apparatus configured to generate an error signal equal to the difference of a target current signal $I_{TGT}$ received from control subsystem 111 and a measured feedback current signal $I_{FB}$.

Loop filter 204 may comprise any system, device, or apparatus configured to receive the error signal from combiner 202 and generate a filtered error signal ERROR to be communicated to quantizer 206 and linear pre-driver 210. In some embodiments, loop filter 204 may comprise a proportional-integral-derivative (PID) controller.

Quantizer 206 may comprise any system, device, or apparatus configured to quantize a signal (e.g., filtered error signal ERROR) to generate an equivalent digital PWM signal.

PWM pre-driver 208 may comprise any system, device, or apparatus configured to receive a quantized PWM signal (e.g., from quantizer 206) and condition such signal for output stage 212. Accordingly, PWM pre-driver 208 may comprise a signal buffer and/or other logic elements to provide control of gate terminals of switches of stage 212. As shown in FIG. 2, PWM pre-driver 208 may be split into two parts, such that one part of PWM pre-driver 208 may generate a first differential pre-drive signal that is a complement of a second differential pre-drive signal driven by the other part of PWM pre-driver 208.

Linear pre-driver 210 may comprise any system, device, or apparatus configured to generate a linear pre-drive signal LINEAR PRE-DRIVE to output stage 212, wherein such linear pre-drive signal LINEAR PRE-DRIVE is a linear function of filtered error signal ERROR. Accordingly, linear pre-driver 210 may implement a linear amplifier. An example embodiment of linear pre-driver 210 is set forth in FIG. 3, discussed in greater detail below.

Output stage 212 may comprise any system, device, or apparatus configured to receive either a quantized PWM signal (e.g., as generated and conditioned by PWM pre-driver stage 208) or a linear pre-drive signal LINEAR PRE-DRIVE and drive an output current signal $I_{OUT}$ to a load (e.g., an inductive load such as a motor 114 of a camera 107 or a haptic transducer). Accordingly, output stage 212 may comprise a plurality of output switches 214 and 216 configured (e.g., in an H-bridge configuration) to generate output current signal $I_{OUT}$ from a modulated signal generated by PWM pre-driver 208 or a linear signal generated by linear pre-driver 210.

As shown in FIG. 2, output stage 212 may include polarity switch 220. When operating in the linear mode of operation, as described in greater detail elsewhere in this disclosure, polarity switch 220 may switch in response to the polarity of target current signal $I_{TGT}$, in order to generate an appropriate polarity of output current signal $I_{OUT}$.

Current monitor 222 may comprise any system, device, or apparatus configured to sense a voltage drop across a sense resistor 218 of output stage 212, wherein such voltage drop is indicative of output current signal $I_{OUT}$, and generate feedback current signal $I_{FB}$.

Figure 3:
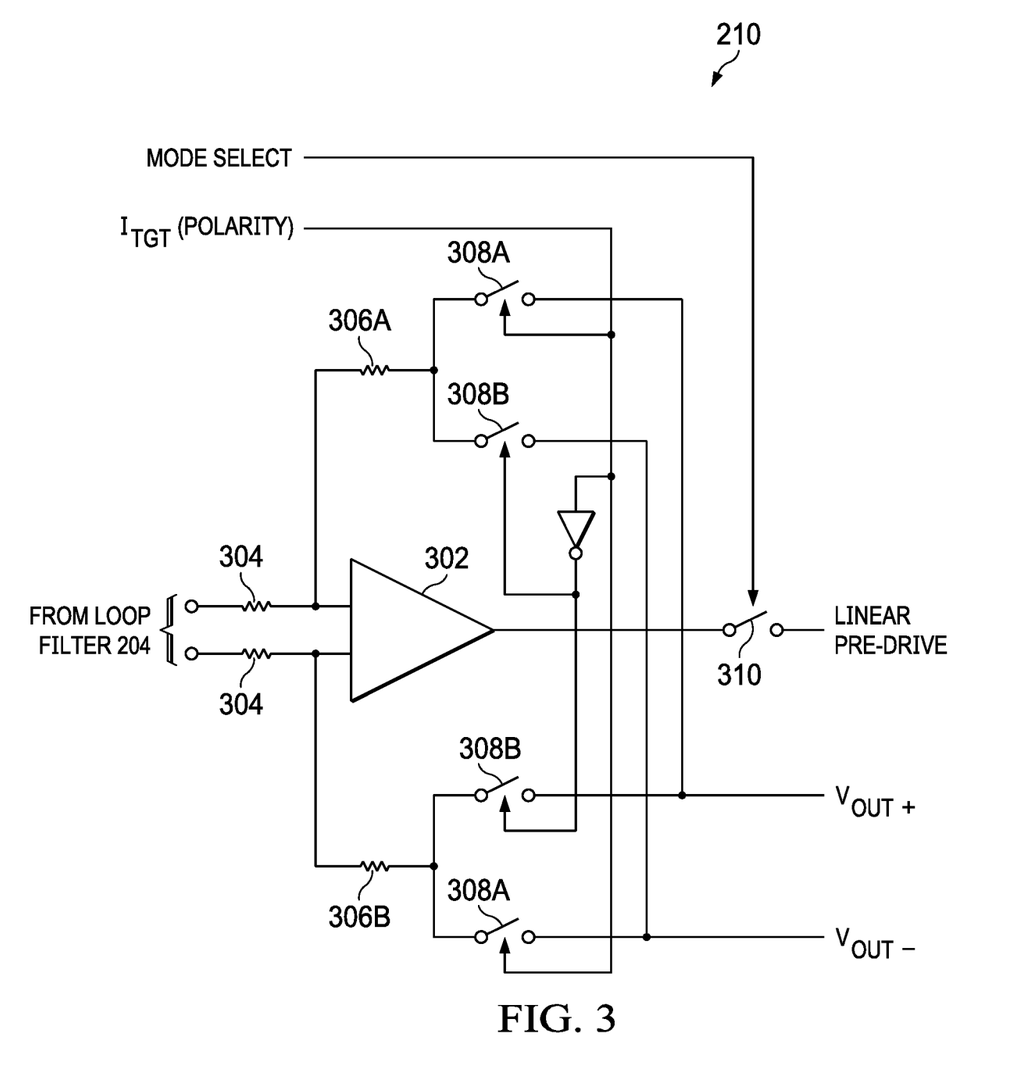
FIG. 3 illustrates a block diagram of selected components of an example linear pre-driver, in accordance with embodiments of the present disclosure.

FIG. 3 illustrates a block diagram of selected components of example linear pre-driver 210, in accordance with embodiments of the present disclosure. As shown in FIG. 3, linear pre-driver 210 may be implemented as differential-input operational amplifier 302 with input resistors 304 each coupled to a respective input of operational amplifier 302 and feedback resistors 306 (e.g., feedback resistor 306A and 306B) coupled between a respective input of operational amplifier 302 and a respective pair of switches 308A and 308B. As will be appreciated by those of skill in the art, a signal gain of linear pre-driver 210 may be set by the resistances of input resistors 304 and feedback resistors 306. During operation of linear pre-driver 210, when a polarity of target current signal $I_{TGT}$ is positive, switches 308A may be enabled (e.g., activated, on, closed) and switches 308B may be disabled (e.g., deactivated, off, open) such that feedback resistors 306A and 306B are coupled to output nodes $V_{OUT}^+$ and $V_{OUT}^-$, respectively, of output stage 212. Conversely, when the polarity of target current signal $I_{TGT}$ is negative, switches 308B may be enabled and switched 308A may be disabled such that feedback resistors 306A and 306B are coupled to output nodes $V_{OUT}^+$ and $V_{OUT}^-$, respectively, of output stage 212. Furthermore, linear pre-driver 210 may be configured to receive a mode selection signal MODE SELECT (e.g., from control subsystem 111), such that when mode selection signal MODE SELECT indicates that a linear mode of operation is selected, switch 310 may be enabled, thus allowing linear pre-driver 210 to drive linear pre-drive signal LINEAR PRE-DRIVE to output stage 212. Conversely, when mode selection signal MODE SELECT indicates that a PWM mode of operation is selected, switch 310 may be disabled (e.g., deactivated, off, open), thus causing linear pre-driver 210 to have a high output impedance (e.g., "tri-stating" the output of linear pre-driver 210). Although not explicitly shown in the FIGURES, PWM pre-driver 208 may also be similarly selectively enabled and disabled based on mode selection signal MODE SELECT.

Accordingly, in operation, control subsystem 111 may selectively assert and deassert mode selection signal MODE SELECT in order to switch between operation of multi-mode current driver 200 in a linear mode of operation in which output stage 212 is pre-driven by linear pre-driver 210 and a PWM mode of operation in which output stage 212 is pre-driven by PWM pre-driver 208. Thus, in systems in which multi-mode current driver 200 drives movement of a slow-moving mass, as may be the case with respect to motors 114 of camera 107, multi-mode current driver 200 may operate in the PWM mode of operation at most times to provide coarse location control to place a camera lens in an approximate desired position, and switch to the linear mode of operation just prior to image capture to provide fine location control with less noise than may be present in PWM mode. Furthermore, to minimize or eliminate signal artifacts associated with such switching, multi-mode current driver 200 may be configured to maintain a constant output current signal $I_{OUT}$ to its load such that a position of the mechanical mass is unchanged during such change between modes of operation.

To further illustrate, during the PWM mode of operation, switches 214 and 216 of output stage 212 may switch at a duty cycle necessary to generate a desired average output current signal $I_{OUT}$. Thus, quantizer 206 may generate a PWM waveform that may set an output voltage proportional to the mathematical product of the duty cycle multiplied by a supply voltage of output stage 212. However, current monitor 222 senses a current which may have a phase shift relative to the voltage driven due to presence of a partially reactive load, causing a pole between output stage 212 and current monitor 222. Accordingly, a compensator may be present within PID control of loop filter 204 to ensure loop stability in presence of this load pole. In addition, the architecture of quantizer 206 may be chosen to provide a fixed gain from the output of loop filter 204 to output stage 212 across a wide operating range of output stage 212 supply voltage and switching frequency, in order to ease loop stabilization.

In the linear mode, in order to achieve fast settling and minimal error when the mode of operation is switched from the PWM mode of operation to the linear mode of operation, and vice versa, the architecture of linear pre-driver 210 may be chosen to have loop characteristics substantially similar to that of the combination of quantizer 206 and PWM pre-driver 208. Thus, linear pre-driver 210 may be part of a localized loop amplifier whose gain is matched to the combination of quantizer 206 and PWM pre-driver 208, such that a localized loop amplifier may drive a voltage that creates the desired current through the load of multi-mode current driver 200. A settled state variable (e.g., output of loop filter 204) may be matched in both the linear and PWM modes of operation for a given output load and output current signal $I_{OUT}$ driven.

Thus, the foregoing discussion discloses a system that includes an output stage (e.g., output stage 212) for driving a load at an output of the output stage, a pulse-width modulation mode path (e.g., combination of quantizer 206 and PWM pre-driver 208) configured to pre-drive the output stage in a first mode of operation (e.g., the PWM mode of operation), a linear mode path (e.g., linear pre-driver 210) configured to pre-drive the output stage in a second mode of operation (e.g., the linear mode of operation), and a loop filter (e.g., loop filter 204) coupled at its input to the output of the output stage and coupled at its output to both the pulse-width modulation mode path and the linear mode path. Further, as discussed above, the pulse-width modulation mode path and the linear mode path may be matched in characteristics such that a first transfer function between the output of the loop filter and the output of the output stage is substantially equivalent to a second transfer function between the output of the loop filter and the output of the output stage.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   an output stage for driving a load at an output of the output stage;
   a pulse-width modulation mode path configured to pre-drive the output stage in a first mode of operation;
   a linear mode path configured to pre-drive the output stage in a second mode of operation; and
   a loop filter, wherein an input of the loop filter is coupled to the output of the output stage and wherein an output of the loop filter is coupled to both of the pulse-width modulation mode path and the linear mode path;
   wherein the pulse-width modulation mode path and the linear mode path are configured such that a first transfer function between the output of the loop filter and the output of the output stage through the pulse-width modulation mode path is substantially equivalent to a second transfer function between the output of the bop filter and the output of the output stage through the linear mode path, such that an output of the loop filter after switching between the first mode of operation and the second mode of operation settles to approximately the same value as the output of the loop filter before switching between the first mode of operation and the second mode of operation.

2. The system of claim 1, wherein the pulse-width modulation mode path comprises a pulse-width modulation quantizer and a pulse-width modulation pre-driver to the output stage.

3. The system of claim 1, wherein the linear mode path comprises a linear pre-driver to the output stage.

4. The system of claim 1, wherein the output stage comprises a voltage driver in both the first mode of operation and the second mode of operation.

5. The system of claim 1, wherein:
the loop filter is configured to output a proportional voltage required to generate a desired output current at the output of the output stage;
in the first mode of operation, the proportional voltage is quantized and buffered by the pulse-width mode modulation path and the output stage to generate the desired output current; and
in the second mode of operation, the proportional voltage is buffered by the linear mode path and the output stage to generate the desired output current.

6. The system of claim 5, wherein in the first mode of operation, the proportional voltage is quantized, buffered, and amplified by the pulse-width mode modulation path and the output stage to generate the desired output current.

7. The system of claim 5, wherein in the second mode of operation, the proportional voltage is buffered and amplified by the linear mode path and the output stage to generate the desired output current.

8. The system of claim 1, wherein the load comprises a motor within a camera module for controlling a position associated with a camera of the camera module.

9. The system of claim 8, wherein an input of the loop filter is indicative of a current for driving the motor.

10. A method comprising:
in a first mode of operation, pre-driving with a pulse-width modulation mode path an output stage for driving a load at an output of the output stage;
in a second mode of operation, pre-driving the output stage with a linear mode path; and
filtering an output signal with a loop filter, wherein an input of the loop filter is coupled to the output of the output stage and wherein an output of the loop filter is coupled to both of the pulse-width modulation mode path and the linear mode path;
wherein the pulse-width modulation mode path and the linear mode path are configured such that a first transfer function between the output of the loop filter and the output of the output stage through the pulse-width modulation mode path is substantially equivalent to a second transfer function between the output of the loop filter and the output of the output stage through the linear mode path,
such that an output of the loop filter after switching between the first mode of operation and the second mode of operation settles to approximately the same value as the output of the loop filter before switching between the first mode of operation and the second mode of operation.

11. The method of claim 10, wherein the pulse-width modulation mode path comprises a pulse-width modulation quantizer and a pulse-width modulation pre-driver to the output stage.

12. The method of claim 10, wherein the linear mode path comprises a linear pre-driver to the output stage.

13. The method of claim 10, wherein the output stage comprises a voltage driver in both the first mode of operation and the second mode of operation.

14. The method of claim 10, further comprising:
outputting by the loop filter a proportional voltage required to generate a desired output current at the output of the output stage;
in the first mode of operation, quantizing and buffering the proportional voltage by the pulse-width mode modulation path and the output stage to generate the desired output current; and
in the second mode of operation, buffering the proportional voltage by the linear mode path and the output stage to generate the desired output current.

15. The method of claim 14, further comprising in the first mode of operation, amplifying the proportional voltage by the pulse-width mode modulation path and the output stage to generate the desired output current.

16. The method of claim 14, further comprising in the second mode of operation, amplifying the proportional voltage by the linear mode path and the output stage to generate the desired output current.

17. The method of claim 10, wherein the load comprises a motor within a camera module for controlling a position associated with a camera of the camera module.

18. The method of claim 17, wherein an input of the loop filter is indicative of a current for driving the motor.

19. The method of claim 10, wherein a feedback path, from the output of the output stage to the input of the loop filter, comprises a current monitor and a combiner, and wherein a transfer function of the feedback path is approximately the same when operating in the first mode of operation and when operating in the second mode of operation.

20. The system of claim 1, comprising a feedback path from the output of the output stage to the input of the loop filter, wherein the feedback path comprises a current monitor and a combiner, and wherein a transfer function of the feedback path is approximately the same when operating in the first mode of operation and when operating in the second mode of operation.

* * * * *

UNITED STATES PATENT AND TRADEMARK OFFICE
CERTIFICATE OF CORRECTION

| | |
|---|---|
| PATENT NO. | : 11,115,046 B2 |
| APPLICATION NO. | : 16/431276 |
| DATED | : September 7, 2021 |
| INVENTOR(S) | : Parupalli et al. |

It is certified that error appears in the above-identified patent and that said Letters Patent is hereby corrected as shown below:

In the Claims

In Column 8, Line 65, in Claim 1, delete "bop" and insert -- loop --, therefor.

Signed and Sealed this
Twenty-ninth Day of August, 2023

Katherine Kelly Vidal
*Director of the United States Patent and Trademark Office*